(12) United States Patent
West

(10) Patent No.: US 9,705,611 B1
(45) Date of Patent: Jul. 11, 2017

(54) SYSTEMS AND METHODS FOR ARRAY ANTENNA CALIBRATION

(71) Applicant: Rockwell Collins, Inc., Cedar Rapids, IA (US)

(72) Inventor: James B. West, Cedar Rapids, IA (US)

(73) Assignee: Rockwell Collins, Inc., Cedar Rapids, IA (US)

(*) Notice: Subject to any disclaimer, the term of this patent is extended or adjusted under 35 U.S.C. 154(b) by 0 days.

(21) Appl. No.: 15/080,325

(22) Filed: Mar. 24, 2016

(51) Int. Cl.
| | |
|---|---|
| *H04B 5/00* | (2006.01) |
| *H04B 17/12* | (2015.01) |
| *G01R 29/08* | (2006.01) |
| *H01Q 21/06* | (2006.01) |
| *H01Q 21/22* | (2006.01) |
| *H04B 17/21* | (2015.01) |

(52) U.S. Cl.
CPC ............ *H04B 17/12* (2015.01); *G01R 29/08* (2013.01); *H01Q 21/061* (2013.01); *H01Q 21/22* (2013.01); *H04B 5/0031* (2013.01); *H04B 17/21* (2015.01)

(58) Field of Classification Search
CPC ...... H04B 17/12; H04B 17/21; H04B 5/0031; G01R 29/08; H01Q 21/061; H01Q 21/22
USPC ...................... 455/41.1, 41.2, 41.3
See application file for complete search history.

(56) References Cited

U.S. PATENT DOCUMENTS

| | | | |
|---|---|---|---|
| 6,208,287 B1 | 3/2001 | Sikina et al. | |
| 7,468,690 B2 | 12/2008 | Green et al. | |
| 7,672,640 B2 * | 3/2010 | Nyshadham | G01R 29/0878 342/153 |
| 8,355,748 B2 * | 1/2013 | Abe | H04W 16/14 370/329 |
| 8,988,280 B2 | 3/2015 | Mosca et al. | |
| 2012/0322380 A1 * | 12/2012 | Nannarone | G08B 13/1427 455/41.2 |
| 2013/0337744 A1 * | 12/2013 | Lefley | H04B 5/00 455/41.1 |
| 2014/0065982 A1 * | 3/2014 | Suh | H04B 1/006 455/77 |
| 2014/0111373 A1 | 4/2014 | Puzella et al. | |
| 2014/0323041 A1 * | 10/2014 | Shana'a | H04B 5/0031 455/41.1 |
| 2016/0301256 A1 * | 10/2016 | Zeine | G09G 5/003 |

* cited by examiner

*Primary Examiner* — Md Talukder
(74) *Attorney, Agent, or Firm* — Donna P. Suchy; Daniel M. Barbieri

(57) ABSTRACT

An antenna array system can comprise an array of antenna elements, a near-field probe (NFP) arranged in a vicinity of the antenna elements, and a processor coupled to the array of antenna elements and to the NFP. The processor can be configured to dynamically switch the antenna array system, while deployed on an operational platform, from an operation mode to a calibration mode, and calibrate the array of antenna elements according to a receive (RX) calibration sub-mode or a transmit (TX) calibration sub-mode. In the RX calibration sub-mode, the processor can be configured to adjust at least one signal reception parameter associated with at least one receiving antenna element of the array of antenna elements. In the TX calibration sub-mode, the processor can be configured to adjust at least one signal transmission parameter associated with at least one transmitting antenna element of the array of antenna elements.

20 Claims, 7 Drawing Sheets

SYSTEMS AND METHODS FOR ARRAY ANTENNA CALIBRATION

BACKGROUND

Antenna arrays can provide improved antenna performance by allowing control of phase and amplitude of the signals associated with various antenna elements in an antenna array. By adjusting signal phase or signal amplitude of separate antenna elements, information redundancy in various signals associated with various antenna elements can be used to form a desired beam signal. In particular, an antenna array can be steered by using variable phase shifters coupled to respective antenna elements in the antenna array to direct the antenna at a pointing angle. The phase shifters can be variable phase shifters configured to induce phase shifts for signals associated with various antenna elements in response to a set of commands. Setting relative phase between signals associated with various antenna elements allows the antenna to be directed or adjusted to appropriate pointing angles without physically moving the antenna elements.

There is a mathematical mapping between the radiating element amplitude and phase excitations of an active electronically scanned array (AESA) and the far field radiation pattern through a Fourier transform relationship. Aperture amplitude and phase errors therefore directly corrupt far field radiation performance. The goal of the AESA calibration is to minimize these errors, and ideally drive them to zero.

The prior art accomplishes calibrations various levels within the AESA subassembly: a) the Radio Frequency Integrated Circuits (RFIC) Transmit/Receive Module (TRM), the AESA feed manifold layer, just short of the radiative aperture layer, and c) within the radiated near field. Radiative near field calibration is the most powerful as it takes into account all mechanisms that contribute to radiation amplitude and phase errors, however, the prior art accomplish this only by means of expensive near field antenna measurement techniques.

Due to the complexity and test equipment expense, near field radiative measurements are accomplished only within a lab or a manufacturing line environment. This results in only a one-time "static" AESA calibration.

The "static" calibration dos not account for operational parameters of a field AESA system such as in-situ vehicular platform induced AESA performance distortion, ongoing prognostic/diagnostic monitoring of electronic device aging and catastrophic failures, or environmentally induced stresses. Furthermore, another deficit of the prior art in non-platform calibration is the inability to perform "self-healing" where the ensemble AESA TRMs are real-time monitored and adjusted for TRM performance degradation and/or catastrophic failure to maintain a prescribed overall AESA performance level. System "self-healing" can maximize system mean time between failures (MTBF), dispatchability and availability.

SUMMARY

In one aspect, the inventive concepts disclosed herein are directed to an antenna array system comprising an array of antenna elements, at least one near-field probe (NFP) configured to support dual polarization and arranged in a vicinity of the antenna elements, and a processor coupled to the array of antenna elements and to the NFP. The processor can be configured to dynamically switch the antenna array system, while deployed on an operational platform, from an operation mode to a calibration mode and calibrate the array of antenna elements according to at least one of a receive (RX) calibration sub-mode and a transmit (TX) calibration sub-mode. In the RX calibration sub-mode, the processor can cause the at least one NFP to transmit a first calibration signal and, responsive to the first calibration signal, the processor can receive a first receive (RX) signal from the array of antenna elements. The processor can compare the first RX signal to a first reference signal, and adjust at least one signal reception parameter associated with at least one antenna element of the array of antenna elements according to the comparison of the first RX signal to the first reference signal. In the TX calibration sub-mode, the processor can be configured to cause one or more antenna elements of the array of antenna elements to transmit a second calibration signal. Responsive to the second calibration signal, the processor can receive, from the at least one NFP, at least one other RX signal. Each of the at least one other RX signal is associated with a respective NFP. The processor can compare each of the at least one other RX signal to a second reference signal and adjust at least one signal transmission parameter associated with at least one antenna element of the one or more antenna elements according to such comparison.

In some embodiments, the at least one NFP can include a dual polarized NFP. In some embodiments, the antenna array system can include a ground plane and at least one of an artificial magnetic conductor arranged between the ground plane and one of the at least one NFP, an artificial magnetic conductor arranged between the ground plane and the array of antenna elements, a choke ring arranged between the ground plane and one of the at least one NFP, and a choke ring arranged between the ground plane and the array of antenna elements. In some embodiments, the antenna array system can also include a network of one or more radio frequency (RF) amplifiers and phase shifters coupled to the array of antenna elements. In some embodiments, the antenna array system can include a network of one or more RF amplifiers and time delay units coupled to the array of antenna elements. In some embodiments, the processor can be configured to calibrate the array of antenna elements according to the RX calibration sub-mode and the TX calibration sub-mode sequentially.

Adjusting the at least one signal reception parameter can include (i) adjusting at least one signal amplitude parameter of at least one RF amplifier coupled to the at least one antenna element, (ii) adjusting at least one signal phase parameter of at least one phase shifter coupled to the at least one antenna element, or (iii) adjusting at least one signal time delay parameter of at least one time delay unit coupled to the at least one antenna element. Adjusting the at least one signal transmission parameter can include (i) adjusting at least one signal amplitude parameter of at least one radio frequency (RF) amplifier coupled to the subset of antenna elements transmitting the second calibration signal, (ii) adjusting at least one signal phase parameter of at least one phase shifter coupled to the subset of antenna elements transmitting the second calibration signal, or (iii) adjusting at least one signal time delay parameter of at least one time delay unit coupled to the subset of antenna elements transmitting the second calibration signal.

In some embodiments, the processor can be configured in the RX calibration sub-mode, for each subset of a plurality of subsets of antenna elements in the array of antenna elements, to activate the subset of antenna elements while deactivating antenna elements in other subsets of antenna elements, and cause the at least one NFP to transmit the first calibration signal. Responsive to the first calibration signal, the processor can receive a respective RX signal associated with the activated subset of antenna elements. The processor can compare the RX signal associated with the activated subset of antenna elements to a first reference signal, and may adjust one or more signal reception parameters associated with the activated subset of antenna elements, according to the comparison of the RX signal associated with the activated subset of antenna elements to the first reference signal. The processor can repeat these steps for various subsets of antenna elements. In some implementations, each subset can include a single antenna element.

In some embodiments, the processor, while in the TX calibration sub-mode, can be configured to, for each subset of a plurality of subsets of antenna elements in the array of antenna elements, cause the subset of antenna elements to transmit the second calibration signal. Responsive to the second calibration signal transmitted by the subset of antenna elements, the processor can receive, from the at least one NFP, at least one other RX signal. Each of the at least one other RX signal is associated with a respective NFP. The processor can compare each of the at least one other RX signal to the second reference signal, and adjust at least one signal transmission parameter associated with the subset of antenna elements, according to such comparison.

In a further aspect, the inventive concepts disclosed herein are directed to a method for calibrating an antenna array system. The method can include dynamically switching, by a processor, the antenna array system, while deployed on an operational platform, from an operation mode to a calibration mode, and calibrating the array of antenna elements according to at least one of a receive (RX) calibration sub-mode and a transmit (TX) calibration sub-mode. In the RX calibration sub-mode, the processor can cause the at least one NFP to transmit a first calibration signal and, responsive to the first calibration signal, the processor can receive a first receive (RX) signal from the array of antenna elements. The processor can compare the first RX signal to a first reference signal, and adjust at least one signal reception parameter associated with at least one antenna element of the array of antenna elements according to the comparison of the first RX signal to the first reference signal. In the TX calibration sub-mode, the processor can be configured to cause one or more antenna elements of the array of antenna elements to transmit a second calibration signal. Responsive to the second calibration signal, the processor can receive, from the at least one NFP, at least one other RX signal. Each of the at least one other RX signal is associated with a respective NFP. The processor can compare each of the at least one other RX signal to a second reference signal and adjust at least one signal transmission parameter associated with at least one antenna element of the one or more antenna elements according to such comparison.

In a further aspect, the inventive concepts disclosed herein are directed to an antenna array system comprising an array of antenna elements, a near-field probe (NFP) arranged in a vicinity of the antenna elements, and a processor coupled to the array of antenna elements and to the a NFP. The processor can be configured to dynamically switch the antenna array system, while deployed on an operational platform, from an operation mode to a calibration mode, and calibrate the array of antenna elements according to at least one of a receive (RX) calibration sub-mode and a transmit (TX) calibration sub-mode. While in the RX calibration sub-mode, the processor can, for each subset of a plurality of subsets of antenna elements in the array of antenna elements, activate the subset of antenna elements while deactivating other subsets of antenna elements in the array of antenna elements, cause the NFP to transmit a first calibration signal, and receive, from the array of antenna elements, a receive (RX) signal responsive to the first calibration signal. The RX signal is associated with the activated subset of antenna elements. The processor can adjust the RX signal associated with the activated subset of antenna elements according to at least one radiation pattern parameter of the activated subset of antenna elements, at least one radiation pattern parameter of the NFP, and at least one propagation path length between the activated subset of antenna elements and the NFP. The processor can also compare the adjusted RX signal associated with the activated subset of antenna elements to a first reference signal, and adjust at least one signal reception parameter associated with the activated subset of antenna elements according to such comparison. In the TX calibration sub-mode, the processor can, for each subset of a plurality of subsets of antenna elements in the array of antenna elements, cause the subset of antenna elements to transmit a second calibration signal, and, responsive to the second calibration signal, receive a second RX signal from the NFP. The processor can adjust the second RX signal according to at least one radiation pattern parameter of the subset of antenna elements, at least one radiation pattern parameter of the NFP, and at least one propagation path length between the subset of antenna elements and the NFP. The processor can compare the adjusted second RX signal to a second reference signal, and adjust at least one signal transmission parameter associated with the subset of antenna elements according to the comparison of the adjusted second RX signal to the second reference signal.

In some embodiments, the NFP can be a dual polarized NFP. In some embodiments, the antenna array system can further include at least one choke ring or at least one artificial magnetic conductor. In some embodiments, the antenna array system can further include a network of one or more amplifiers and phase shifters coupled to the array of antenna elements. In some embodiments, the antenna array system of can further include a network of one or more amplifiers and time delay units coupled to the array of antenna elements.

In some embodiments, the at least one radiation pattern parameter of the activated subset of antenna elements can include at least one of a radiation amplitude associated with a lookup angle, a radiation phase associated with the lookup angle, and a radiation time delay associated with the lookup. In some embodiments, the at least one radiation pattern parameter of the NFP can include at least one of a radiation amplitude associated with a lookup angle, a radiation phase associated with the lookup angle, and a radiation time delay associated with the lookup.

In some embodiments, adjusting the at least one signal reception parameter can include (i) adjusting at least one signal amplitude parameter of at least one RF amplifier coupled to the activated subset of antenna elements, (ii) adjusting at least one signal phase parameter of at least one phase shifter coupled to the activated subset of antenna elements, or (iii) adjusting at least one signal time delay parameter of at least one time delay unit coupled to the activated subset of antenna elements. Adjusting the at least one signal transmission parameter can include (i) adjusting at least one signal amplitude parameter of at least one radio frequency (RF) amplifier coupled to the subset of antenna elements transmitting the second calibration signal, (ii) adjusting at least one signal phase parameter of at least one phase shifter coupled to the subset of antenna elements transmitting the second calibration signal, or (iii) adjusting at least one signal time delay parameter of at least one time delay unit coupled to the subset of antenna elements transmitting the second calibration signal.

In a further aspect, the inventive concepts disclosed herein are directed to a method for calibrating an antenna array system. The method can include dynamically switching, by a processor, an antenna array system, while deployed on an operational platform, from an operational mode to a calibration mode, and calibrating the array of antenna elements according to at least one of a receive (RX) calibration sub-mode and a transmit (TX) calibration sub-mode. In the RX calibration sub-mode, the method can include, for each subset of a plurality of subsets of antenna elements in the array of antenna elements, the processor activating the subset of antenna elements while deactivating other subsets of antenna elements in the array of antenna elements, causing the NFP to transmit a first calibration signal, and receiving, from the array of antenna elements, a receive (RX) signal responsive to the first calibration signal. The RX signal is associated with the activated subset of antenna elements. The method can also include the processor adjusting the RX signal associated with the activated subset of antenna elements according to at least one radiation pattern parameter of the activated subset of antenna elements, at least one radiation pattern parameter of the NFP, and at least one propagation path length between the activated subset of antenna elements and the NFP. The method can also include the processor comparing the adjusted RX signal associated with the activated subset of antenna elements to a first reference signal, and adjusting at least one signal reception parameter associated with the activated subset of antenna elements according to such comparison. In the TX calibration sub-mode, the method can include, for each subset of a plurality of subsets of antenna elements in the array of antenna elements, the processor causing the subset of antenna elements to transmit a second calibration signal, and, responsive to the second calibration signal, receiving a second RX signal from the NFP. The method can also include the processor adjusting the second RX signal according to at least one radiation pattern parameter of the subset of antenna elements, at least one radiation pattern parameter of the NFP, and at least one propagation path length between the subset of antenna elements and the NFP. The method can also include the processor comparing the adjusted second RX signal to a second reference signal, and adjusting at least one signal transmission parameter associated with the subset of antenna elements according to the comparison of the adjusted second RX signal to the second reference signal.

In some embodiments, adjusting the at least one signal reception parameter can include (i) adjusting at least one signal amplitude parameter of at least one RF amplifier coupled to the activated subset of antenna elements, (ii) adjusting at least one signal phase parameter of at least one phase shifter coupled to the activated subset of antenna elements, or (iii) adjusting at least one signal time delay parameter of at least one time delay unit coupled to the activated subset of antenna elements. Adjusting the at least one signal transmission parameter can include (i) adjusting at least one signal amplitude parameter of at least one radio frequency (RF) amplifier coupled to the subset of antenna elements transmitting the second calibration signal, (ii) adjusting at least one signal phase parameter of at least one phase shifter coupled to the subset of antenna elements transmitting the second calibration signal, or (iii) adjusting at least one signal time delay parameter of at least one time delay unit coupled to the subset of antenna elements transmitting the second calibration signal.

BRIEF DESCRIPTION OF THE DRAWINGS

Embodiments of the inventive concepts disclosed herein will become more fully understood from the following detailed description, taken in conjunction with the accompanying drawings, wherein like reference numerals refer to like elements, in which.

DETAILED DESCRIPTION

Figure 1:
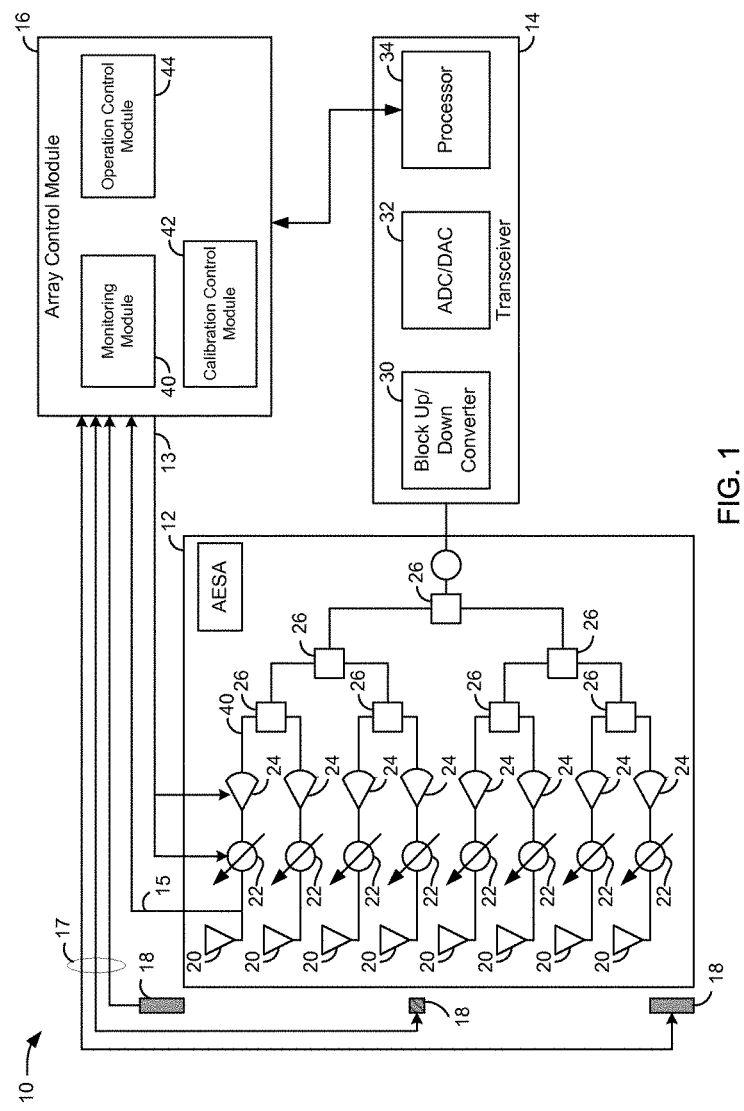
FIG. 1 is a block diagram of an array antenna system capable of performing in-situ calibration in accordance with some embodiments of the inventive concepts disclosed herein.

Before describing in detail embodiments of the inventive concepts disclosed herein, it should be observed that the inventive concepts disclosed herein include, but are not limited to a novel structural combination of components and circuits, and not to the particular detailed configurations thereof. Accordingly, the structure, methods, functions, control and arrangement of components and circuits have, for the most part, been illustrated in the drawings by readily understandable block representations and schematic diagrams, in order not to obscure the disclosure with structural details which will be readily apparent to those skilled in the art, having the benefit of the description herein. Further, the inventive concepts disclosed herein are not limited to the particular embodiments depicted in the schematic diagrams, but should be construed in accordance with the language in the claims.

Antenna arrays can employ steerable arrays (or arrays of steerable antenna elements) to improve antenna reception, or transmission, performance. In particular, an antenna array system can employ constructive, or destructive, interference of signals, or waves, associated with various antenna elements to generate desired signal, or wave, beams. Constructive, or destructive interference can be achieved, for example, by adjusting phase or amplitude parameters associated with various antenna elements. Antenna array systems can include, but are not limited to, phased-array antenna systems or electronically scanned array (ESA) antenna systems, such as active electronically-scanned array (AESA) antenna systems. An antenna array system can be used as a stand-alone antenna system or can be a part of a larger antenna system. Antenna array systems can be utilized in communication systems, satellite communications systems, (SatCom) sensing and/or radar systems, such as, military radar systems or weather radar systems, electronic intelligence (ELINT) receivers, electronic counter measure (ECM) systems, electronic support measure (ESM) systems, targeting systems, biological or medical microwave imaging systems, or other systems. The AESAs in the systems can employ planar apertures or non-planar apertures such as cylindrical, spherical, conical or any arbitrary single or double curved surfaces to allow conformal attachment to vehicular platform surfaces, such as aircraft fuselages, for example.

Antenna array systems are usually calibrated prior to their deployment on an operational platform, such as an aircraft, a ship, a vehicle or any other platform. The calibration process can include setting one or more parameter values of an array antenna, such as relative phase and relative amplitude values of the antenna elements with respect to each other, for example, to achieve desired phase and/or amplitude distributions at the surface of the antenna array. Calibration of the antenna array prior to deployment can include regulating the respective parameters to optimize antenna array system performance in the calibration environment. However, deployment environment conditions may be significantly different, or may vary significantly over time, from calibration environment conditions. For example, calibration may be performed at room temperature while temperature associated with the operational platform, such as an aircraft, may vary significantly over time. For instance, at high altitudes, the air temperature is significantly lower than room temperature. Also, other environment conditions such as humidity, atmospheric pressure, lighting conditions, and/or vibration can vary in the deployment environment compared to the calibration environment.

Changes in environment conditions can affect electrical and/or mechanical components of the antenna array system in different ways. For example, impedance or permittivity of the antenna elements (or other components of the array antenna) may change responsive to changes in one or more environment conditions. Also, changes in environment conditions can alter inter-element mutual coupling parameters. Changes in impedance, permittivity, mutual coupling parameters, or other parameters associated with one or more components of the antenna array system can render the calibrated parameters (e.g., relative phase or relative amplitude values) inadequate for providing a desired antenna performance. Furthermore, active circuits within the TRMs that develop the inter-element relationships of amplitude, phase and time delay can also be adversely affected by changes in environment conditions.

When an antenna array system is deployed on an operational platform, the respective antenna elements can undergo "soft" or "hard" failures. A "soft" failing antenna element can be still operating (or functioning) but not according to predefined or desired specifications. "Soft" failures can occur as a result of aging, environmentally induced stresses, or other factors. A "hard" failing antenna element can be one that is failing completely or catastrophically, for example, due to mechanical deformation or deficiency in electrical connections. Such failures, whether "soft" or "hard" can degrade the overall performance of the antenna array system.

In order to mitigate performance degradation post deployment, for example, due to environment conditions or partial or complete component failures, an antenna array system can be configured to perform real-time in-situ (i.e., while deployed) calibration. The antenna array system can perform in-situ calibration periodically or responsive to specific events or conditions. During in-situ calibration, the antenna array can adjust one or more respective parameter, such as phase or amplitude parameters associated with respective antenna elements, to eliminate or mitigate any potential performance degradation.

In the current disclosure, antenna array systems, of arbitrary aperture shape, configured to perform in-situ calibration and respective in-situ calibration methods are disclosed. The antenna array systems and the calibration methods can allow for diagnostic or prognostic remediation of antenna array performance degradation. For example, the antenna array system can monitor reception or transmission performance and perform calibration responsive to a detected degradation in performance. In some embodiments, the antenna array system can anticipate (or predict) performance degradation, for example based on sensor data indicative of substantial changes in environment conditions or based on monitoring data of antenna elements, and calibrate the antenna array system in response to such prediction.

Inventive concepts described herein enable a dynamic calibration accounting for operational parameters of a field AESA system such as in-situ vehicular platform induced AESA performance distortion, ongoing prognostic/diagnostic monitoring of electronic device aging and catastrophic failures, environmentally induced stresses. Furthermore, this invention enables "self-healing" where the AESA TRMs are real-time monitored and adjusted for TRM performance degradation and/or catastrophic failure. This benefit is critical to maximize system mean time between failures (MTBF), dispatchability and availability.

With reference to FIG. 1, an antenna array system 10 includes a steerable array 12, a transceiver 14, an array control module 16, and one or more near field probes (NFPs) 18. The steerable array 12 includes a plurality of antenna elements 20, a plurality of phase shifters 22, a plurality of radio frequency (RF) amplifiers 24 (such as variable gain amplifiers (VGAs)), and/or a plurality of power splitters 26. The transceiver 14 includes a block up/down converter 30, and analog-to-digital/digital-to-analog converter (ADC/DAC) 32, and/or a processor 34. The array control module 16 includes a monitoring module 40, an operation control module 42, and/or a calibration control module 44. In more general embodiments, the variable amplitude can be omitted for a uniformly excited passive ESA (PESA), or replaced by fixed or switched digital attenuators.

The plurality of antenna elements 20 form an array. The array of antenna elements 20 can be a one-dimensional (1-D) array, a two-dimensional (2-D) array, or a three-dimensional (3-D) array. Each of the antenna elements 20 can act as a separate antenna configured to receive, transmit, simultaneously receive and transmit for full-duplex AESAs, or alternate between transmitting and receiving radio frequency (RF) signals. The plurality of antenna elements 20 are coupled to a beam forming feed network including phase shifters 22 and RF amplifiers 24. While FIG. 1 shows a single beam forming feed network of phase shifters 22 and RF amplifiers 24, the plurality of antenna elements 20 can be coupled to more than one network of phase shifters 22 and RF amplifiers 24. For example, the plurality of antenna elements 20 can be coupled to a first network of phase shifters 22 and RF amplifiers 24 configured to act as a receive (RX) beam forming feed network (or RX beam forming feed circuit) and a second network of phase shifters 22 and RF amplifiers 24 configured to act as a transmit (TX)

beam forming feed network (or TX beam forming feed circuit). Using a parallel configuration of the RX and TX beam forming feed networks allows for independent and simultaneous steering of RX and TX AESA beams.

In some embodiments, time delay units can be employed, for example, instead of (or in combination with) the phase shifters 22. In other words, RF signals directed to or received at the antenna elements 20 can be time delayed according to a plurality of time delay values in order to steer the array of antenna elements towards a specific direction. While phase shifters 22 may accurately model differences in time of arrival (ToA) of narrow-to-moderate bandwidth signals associated with various antenna elements 20, the phase shifters 22 may not be as accurate in modeling differences in ToA for ultra wide band (UWB) signals. However, time delays units provide better accuracy in modeling the differences in ToA for narrow-to-moderate bandwidth signals or UWB signals. The time delay units can be used in the RX beam forming feed network and/or the TX beam forming feed network.

The RX beam forming feed network (or RX beam forming feed circuit) can be classic n-way feed distribution network. In a RX beam forming feed network (or RX beam forming feed circuit), power combiners can be used instead of the power splitters 26 Each antenna element 20 can be coupled to a respective phase shifter 22, or a time delay unit, and a respective RF amplifier 24. Upon receiving an electromagnetic wave, an antenna element 20 can produce a corresponding RF signal that is then phase shifted, or time delayed, by the respective phase shifter 22, or respective time delay unit, and amplified by the respective RF amplifier 24. Power combiners can sum up RF signals from the plurality of antenna elements 20 into a single cumulative RF signal that is then received by the transceiver 14. In some embodiments, the transceiver 14 can be directly connected to the antenna elements 20, respective phase shifters 22 (or time delay units), or respective RF amplifiers 24 for example, through couplers (not shown in FIG. 1). The transceiver can receive a separate RF signal from each antenna element 20.

The TX beam forming feed network (or TX beam forming feed circuit) can be classic n-way feed distribution network. The power splitters 26 can be arranged in various fashions to communicate RF signals between the transceiver 14 and the antenna elements 20. The power splitters 26 can be implemented as directional couplers. The power splitters 26 can be active or passive components. Each antenna element 20 can be coupled to a respective phase shifter 22, or a respective time delay unit, and a respective RF amplifier 24. The transceiver 14 can generate an RF signal that is then split by the power splitters 26 into a plurality of RF split signals, each of which is destined for a respective antenna element 20. Each RF split signal associated with a respective antenna element 20 can be amplified by a RF amplifier 24 associated with the antenna element 20 and phase shifted, or time delayed, by a respective phase shifter 22, or a respective time delay unit, before reaching the antenna element 20. The antenna element 20 can then transmit an electromagnetic wave corresponding to the amplified and phase-shifted, or time-delayed, RF split signal. In some embodiments, the power splitters 26 can be optional.

In some embodiments, the RF amplifiers 24 can be implemented as part of the phase shifters 22, the time delay units, the power combiners, or the power splitters 26. In some embodiments, the RF amplifiers 24 can be arranged before and after the phase shifters 22, or the time delay units. In some embodiments, the steerable antenna array 12 can be implemented as a Balanced Antipodal Vivaldi Array (BAVA) or other array apertures known in the art. In some embodiments, the steerable antenna array 12 can be an AESA. In some embodiments, the antenna elements 20 can be dual polarized antenna elements or linear polarized antenna elements arranged to form a dual polarization array. A dual polarization array can be configured to receive or transmit elliptical polarization signals, circular polarization signals, or other dual polarization signals.

The antenna array system 10 includes one or more NFPs (or calibration antennas) 18 arranged in the vicinity of the array(s) of antenna elements 20 and configured to transmit or receive RF signals. In some embodiments, the antenna array system 10 can include a single NFP 18. In some embodiments, the antenna array system 10 can include a plurality of NFPs 18. The plurality of NFPs 18 can be arranged around (in the proximity of) the array of antenna elements 20. Some of the NFPs 18 can arranged according to different orientations. For example, one NFP 18 can be oriented orthogonal to another NFP 18. In some embodiments, at least one NFP 18 is a dual polarized calibration antenna. In some embodiments, the NFPs 18 can be linear polarized antennas with at least a pair of NFPs 18 being arranged in close proximity and orthogonal to one another in order to support dual polarization. During calibration of the antenna array system 10, the NFP(s) 18 can transmit RF signals while the array of antenna elements 20 can act as a receiver, or the array of antenna elements 20 can transmit RF signal(s) while the NFP(s) 18 can act as receiver(s).

Supporting dual polarization may be hindered by a ground plane (not shown in FIG. 1) of the antenna array system 10. The antenna array system 10 can include a ground plane providing a common electric ground for the antenna array elements 20 and electronic components of the steerable array 12. The ground plane can be in close proximity to the dual polarized NFP(s) 18. As such, the ground plane can interfere with dual polarized electromagnetic waves traveling between the NFP(s) 18 and the array of antenna elements 20 and can make it difficult to sustain horizontal polarization (e.g., based on boundary conditions of Maxwell's equations). To overcome an undesired effect of the ground plane on dual polarized waves traveling between the NFP(s) 18 and the antenna elements 20, the antenna array system 10 can further include at least one artificial (or synthetic) magnetic conductor (AMC) or at least one choke ring.

Figure 2:
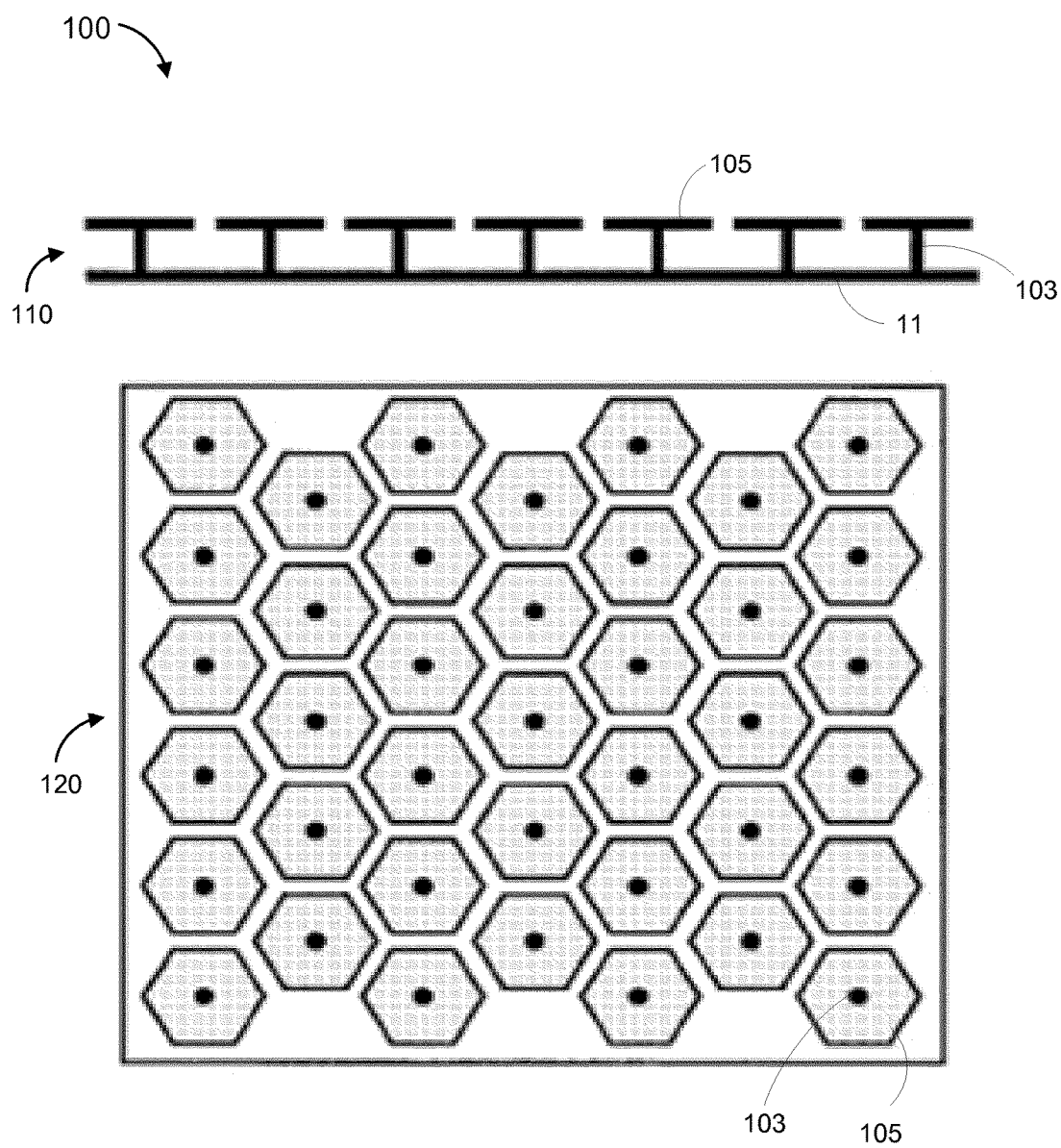
FIG. 2 shows a diagram of an artificial magnetic conductor for use in an antenna array system according to embodiments of the inventive concepts disclosed herein.

With reference to FIG. 2, diagrams of a side view 110 and a top view 120 of an artificial magnetic conductor 100 are illustrated. The artificial magnetic conductor 100 shown in FIG. 2 is implemented as an electromagnetic band gap (EBG) structure. However, other types of artificial magnetic conductors are also contemplated by the current disclosure. The artificial magnetic conductor 100 includes a plurality of planar metal patches 105. Each metal patch 105 is coupled to a ground plane 11 of the antenna array system 10 with a respective metal pin 103. During resonance, the metal patches 105 act like capacitors with capacitance impedance coupling between different metal patches 105 and shunt capacitance to ground, whereas the metal pins 103 act like inductors as they create shunt impedance between the respective metal patches 105 and the ground plane 11.

In some embodiments, at least one NFP 18 can be arranged on and coupled to the metal patches of the artificial magnetic conductor 100. In a resonance state, the surfaces of the metal patches 105 facing the NFP 18 act like an open circuit. While the ground plane 11 attenuates the magnitude of an electric field component parallel to its plane to zero (or close to zero), the artificial magnetic conductor 100 arranged between the NFP 18 and the ground plane 11 mitigates such effect of the ground plane 11 and therefore enhances NFP reception of electric field components that are parallel to the ground plane 11. In other words, the artificial magnetic conductor 100 allows the NFP 18 sitting on it to more efficiently receive electromagnetic field components parallel to the ground plane 11 than an NFP 18 sitting on the ground plane 11. As such, the artificial magnetic conductor 100 improves the aggregate signal-to-noise ratio (SNR) between the array of antenna elements 20 and the NFP 18 coupled to the artificial magnetic conductor 100 without necessarily increasing the transmission power. Such improvement is achieved in cases when the array of antenna elements 20 is transmitting and the NFP 18 is receiving or when the NFP 18 is transmitting and the array of antenna elements 20 is receiving. Accordingly, the artificial magnetic conductor 100 allows efficient and accurate calibration of a steerable array 12 supporting dual polarization by mitigating the effect on the ground plane 11 of the antenna array system 10.

In some embodiments, the artificial magnetic conductor 100 can be arranged between the array of antenna elements 20 and the ground plane 11. In some embodiments, multiple artificial magnetic conductors 100 can be employed in the antenna array system 10. For example, a respective artificial magnetic conductor 100 can be arranged between each NFP 18 and the ground plane 11 and an additional artificial magnetic conductor 100 can be arranged between the array of antenna elements 20 and the ground plane 11. Using artificial magnetic conductors 100 associated with the NFP(s) 18 and the array of antenna elements 20 can further improve the SNR between the array of antenna elements 20 and the NFP(s) 18 compared to using such artificial magnetic conductors 100 in association with one of the array of antenna elements 20 and the NFP(s) 18. However, introducing an artificial magnetic conductor 100 between the array of antenna elements 20 and the ground plane 11 adds to the complexity of the architecture of the steerable array 12.

In some embodiments, a choke ring can be employed instead of the artificial magnetic conductor 100. In particular, one or more choke rings can be arranged between the NFP(s) 18 and the ground plane 11 and/or between the array of antenna elements 20 and the ground plane 11. Choke rings, similar to artificial magnetic conductors, allow for improved reception of dual polarized electromagnetic waves between the array of antenna elements 20 and the NFP(s) 18. In some embodiments, a combination of choke rings and artificial magnetic conductors 100 can be employed in association with the NFP(s) 18 and the array of antenna elements 20. When using artificial magnetic conductor(s) 100 or choke ring(s), the NFP(s) 18 can be arranged to be in-line (or at the same level) with a plane of the array of antenna elements 20 or can be arranged at an offset distance from the plane of the array of antenna elements 20.

Referring back to FIG. 1, the antenna array system 10 includes a transceiver 14. The transceiver 14 can operate as a receiver only, transmitter only, or both a transmitter and a receiver, either in half-duplex or full-duplex configurations. In some embodiments, the antenna array system 10 can include a plurality of transceivers 14. In some embodiments, the transceiver 14 can be implemented as on one or more RF integrated circuits, or modules. The transceiver 14 can be implemented as a hard wired circuit, application specific integrated circuit (ASIC), programmable logic device, operational processor or a combination thereof.

The transceiver 14 includes a block up/down converter 30, an analog-to-digital converter/digital-to-analog converter (ADC/DAC) 32, and an processor 34. The transceiver 14 can transmit RF signals to, or receive RF signals from, the steerable array 12. The block up/down converter 30 can up convert signals destined for the steerable array 12 to a higher frequency band and down convert RF signals received from the steerable array 12 to a base band. The ADC/DAC 32 can convert analog base signals output by the block up/down converter 30 to corresponding digital signals or can convert digital signals received from the processor 34 to corresponding analog signals. In some embodiments, every antenna element 20 can be associated with a respective block up/down converter 30 and ADC/DAC 32. In such embodiments, the power splitters 26 or the power combiners can be configured to operate at either at an analog Intermediate Frequencies (IF) or a digital bit stream. The processor 34 can be configured to control the steerable array 12, for example, by switching the steerable array 12 between different modes. The steerable array 12, or the antenna array system 10 in general, can operate according to an operation mode or a calibration mode. Each of the operation and calibration modes can include a receive (RX) sub-mode and a transmit (TX) sub-mode. These modes and sub-modes are discussed in further detail below. The processor 34 can determine when the antenna array system 10 is to operate in any of these modes and respective sub-modes and cause the antenna array system 10 to switch between these modes and respective sub-modes.

The array control module 16 can be a software module operating on a computer platform or the processor 34, an ASIC, a digital signal processor (DSP), a programmable logic device, a hardware circuitry, or a combination thereof. The array control module 16 can include a monitoring module 40, a calibration control module, 42 and an operation control module 44. The monitoring module 40 can be configured to switch between the operation mode and the calibration mode. In some embodiments, the monitoring module 40 can monitor a timer and cause switching (e.g., by sending instruction commands to various components) between the two modes periodically, according to a predefined time schedule, or based on or more detected events. During operation mode, the operation control module 44 can control the steerable array 12, for example, by switching between respective RX and TX sub-modes and/or by controlling parameters associated with the phase shifters 22, the time delay units, and/or the RF amplifiers 24. During calibration mode, the calibration control module 42 can control the steerable array 12 and the NFPs 18. In some embodiments, the operation control module 44 and the calibration control module 42 can be implemented as a single module.

In some embodiments, the monitoring module 40 can be configured to monitor the "health" of the steerable array 12. The monitoring module 40 can be coupled to sniffing circuits or sniffing connections such as connection 15 and can receive measurement values indicative of the "health" of one or more components of the steerable array 12. Connection 15 can be implemented as an RF directional coupler for power detection. In some implementations, connection 15 can include a phase detector for phase monitoring, a timing circuit for time delay measurement, or a high impedance probe for power detection. In some implementations, the monitoring module 40 can be coupled to at least one of direct current (DC) or voltage measurement circuits (not shown in FIG. 1). A direct current measurement circuit can be configured to measure power used in a phase shifter 22 or time delay unit to infer a respective amount of power provided by that phase shifter 22 or the time delay unit. The direct current measurement circuits can be integrated within the phase shifters 22 or within the time delay units, or can be distinct components. In some embodiments, the direct current measurement circuits can be configured to monitor current provided to RF amplifiers 24 or amplifying components within the phase shifters 22 or within time delay units. In general, the current measurement circuit can be an electronic component capable of detecting a level of power, current, or voltage associated with a signal. The radio frequency power detection circuits can be configured to measure the power at respective antenna elements 20 and provide a measurement signal or data to the monitoring module 40. In some embodiments, the radio frequency power detection circuits can be radio frequency coupled devices coupled at locations associated with respective antenna elements 20.

The monitoring module 40 can compare measured, or inferred, power values to respective desired powers (or amplitudes) for various antenna elements. The monitoring module 40 can be coupled to one or more phase (or time delay) verification circuits configured to measure the relative phase (or relative time delay) associated with each of the antenna elements 20. The monitoring module 40 can then compare the measured relative phase (or time delay), for each antenna element 20, to a respective desired phase shift (or time delay) value, such as a phase shift (or time delay) value provided by the operation module 44 (or the calibration control module 42).

In some embodiments, the monitoring module 40 can be configured to monitor the operational "health" of the antenna elements 20 and/or respective circuit components, such as RF amplifiers 24, phase shifters 22, and/or time delay units, for example, while the steerable array is in operation mode. In some embodiments, the monitoring module 40 can be configured to monitor the operational "health" of the antenna elements 20 and/or respective components while the steering array 12 is in calibration mode. In some embodiments, the monitoring module 40 can be configured to switch between operation and calibration modes in response to "health" assessment of the steerable array 12 or one or more components thereof. In some embodiments, the monitoring module 40 can deactivate, or shut down, (or instruct the operation control module 44 or the calibration control module 42 to deactivate) one or more antenna elements 20 permanently or temporarily responsive to respective "health" assessment. For example, the monitoring module 40 can cause deactivation of an antenna element 20 upon detection of persistent or substantial "health" degradation (such as based on measured health parameters).

In some embodiments, the monitoring module 40 can be configured to continuously monitor the aggregate "health" of the steerable array 12 while in operation mode, and initiate a diagnostic or prognostic process either on a regular basis or upon detecting discrepancy in the aggregate health of the steerable array 12. During the diagnostic or prognostic process, the monitoring module 40 can be configured to assess the health of each antenna element 20 separately, for example, to check for any "softly" or "hardly" failing antenna element. The diagnostic or prognostic process can be performed during the calibration mode.

The operation control module 44 can be configured to control the steerable array 12 during operational system mission phases (or operation mode). The operation control module 44 can be configured to provide phase shift (or time delay) commands to phase shifters 22, or time delay units, and/or provide amplitude (or power) weighting commands to RF amplifiers 24, for example, through command lines 13. Phase shift commands (or values) and amplitude (or power) weighting commands (or values) can be stored in memory (not shown in FIG. 1) of the antenna array system 10. The operation control module 44 can be configured to select, for example, based on a beam pointing angle parameter, environmental parameter(s), frequency parameter(s), proper phase shift (or time delay) values or amplitude (or power) weighting values for various antenna elements 20. In some embodiments, the operation control module 44 can use a look-up table to determine a set of phase shift (or time delay) commands or amplitude (or power) weighting commands for a given beam pointing angle. In some embodiments, the operation control module 44 can also cause transmit RF signals to be provided to the steerable array 12, or cause received signals from the steerable array 12 to be processed. In some embodiments, portions of the monitoring module 40, the operational control module 44 and the calibration control module 42 can exist in digital memory integrated into the TRM RFICs in order to optimally partition the digital architecture to optimize digital bus speed, beam command time latency, circuit complexity, etc., as a particular systems requirements dictates.

During the calibration mode, the calibration control module 42 can be configured to adjust and/or reset parameters of the steerable array 12 using a loop back radiative calibration procedure that involves transmission and/or reception of RF signals between the NFP(s) 18 and the array of antenna elements 20. In some embodiments, the calibration mode can include at least one of a RX calibration sub-mode and a TX calibration sub-mode. In a RX calibration sub-mode, the array of antenna elements 20 can be configured to act as a receiver while the NFP(s) 18 can be configured to act as transmitter(s). In such a sub-mode, the calibration control module 42 can (1) cause the NFP(s) 18 to transmit a calibration signal, (2) obtain a respective receive (RX) signal from the steerable array 12, (3) compare the RX signal to a reference signal (or compare respective parameters), and (4) adjust reception parameters of the steerable array 12 based on such comparison. In the TX calibration sub-mode, the array of antenna elements 20 can be configured to act as a transmitter while the NFP(s) 18 can be configured to act as receiver(s). In such a sub-mode, the calibration control module 42 can (1) cause at least one antenna element 20 to transmit a calibration signal, (2) obtain one or more respective receive (RX) signals from the NFP(s) 18, (3) compare the one or more RX signals to a reference signal (or compare respective parameters), and (4) adjust transmission parameters of the steerable array 12 based on such comparison.

Figure 3:
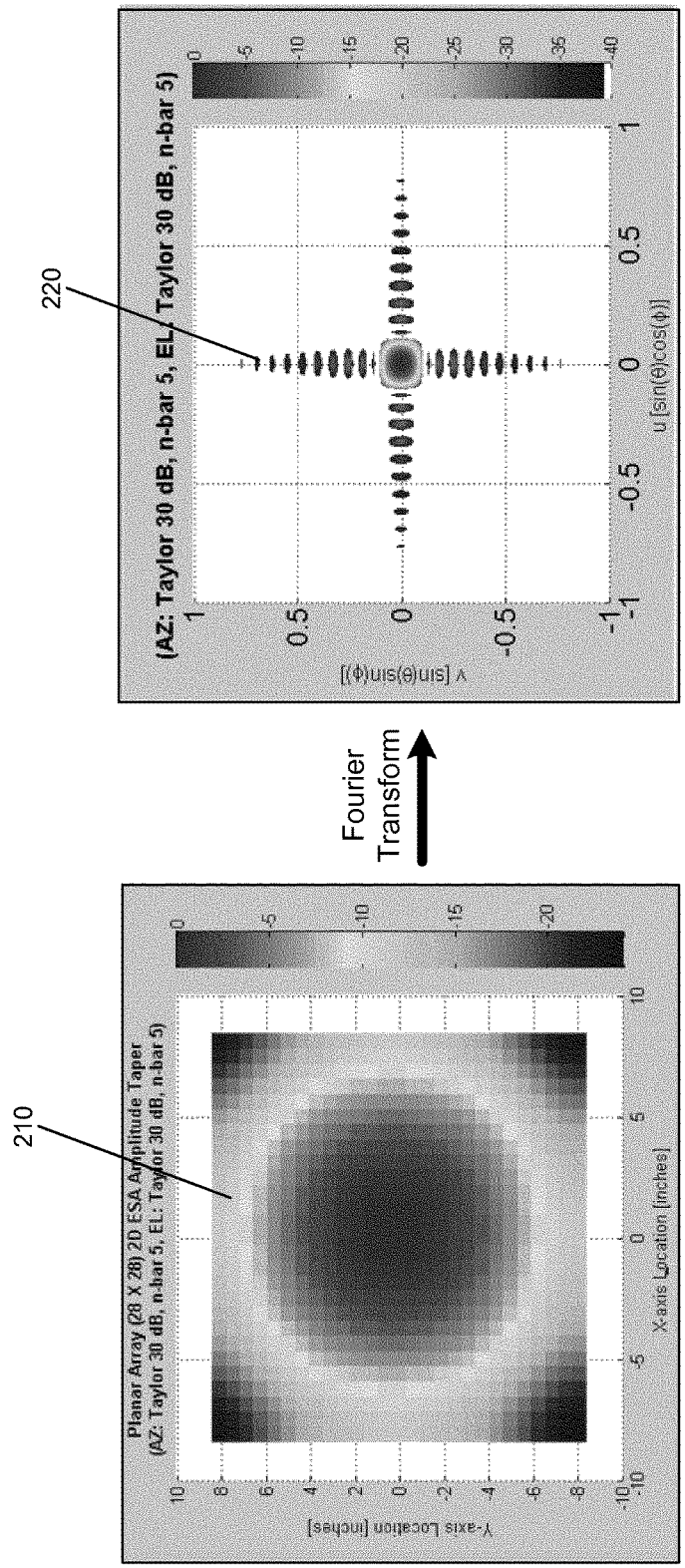
FIG. 3 shows plots of embodiments of an aperture excitation and a corresponding far field radiation pattern.

With reference to FIG. 3, plots of an aperture excitation 210 and a corresponding far field radiation pattern 220 associated with a steerable array are illustrated. In particular, the aperture excitation plot 210 shows a 2-D spatial distribution of an aperture excitation amplitude. In a 2-D antenna array, such amplitude distribution can represent the relative excitation signal amplitudes associated with various antenna elements in a 2-D antenna array. The far field radiation pattern plot 220 represents a 2-D spatial distribution of amplitudes of the far field corresponding to the aperture excitation shown in the aperture excitation plot 210. As illustrated in FIG. 3, the far field (or the near field) radiation pattern can be computed as the Fourier transform of the aperture excitation. While FIG. 3 shows only spatial amplitude distributions of the aperture excitation and the corresponding far field, the aperture excitation and the corresponding far field can be characterized by phase distributions.

In some embodiments, the calibration control module 42 can use a given aperture excitation (or respective relative amplitudes and relative phases among various antenna elements) as a reference in the calibration process. In other words, relative amplitudes and relative phases of RX signals associated with various antenna elements 20 can be compared to relative amplitudes and relative phases, respectively, of a predefined aperture excitation.

Figure 4:
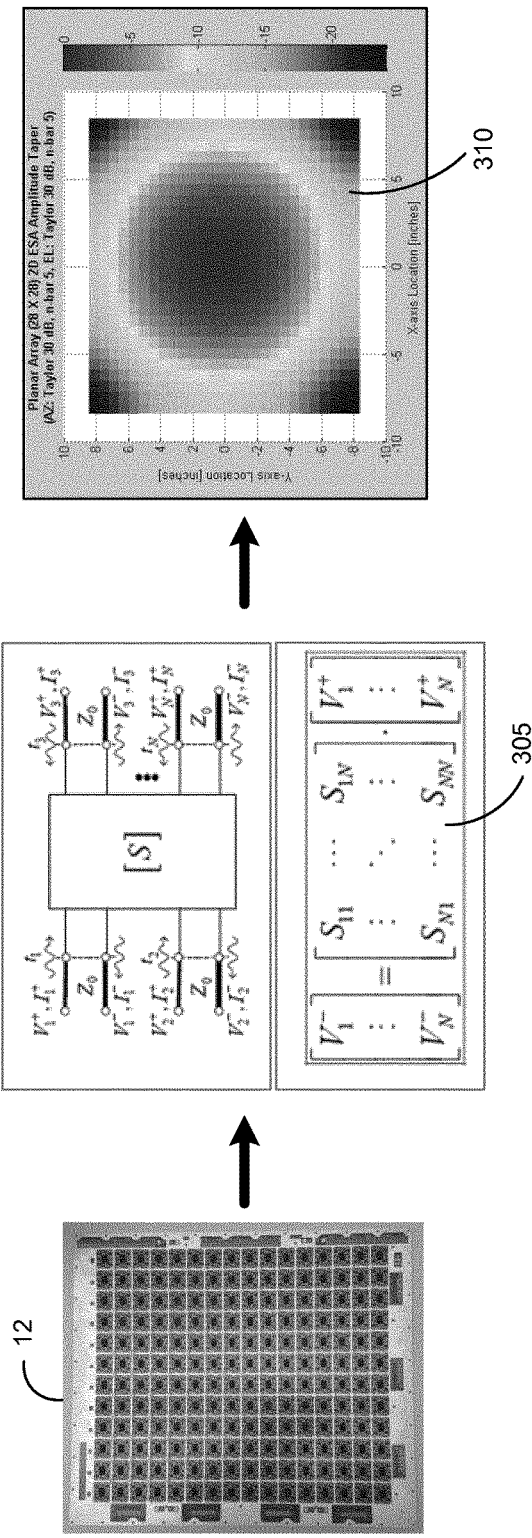
FIG. 4 is a diagram illustrating one embodiment of a relationship between mutual coupling parameters of antenna elements in a steerable array and a respective complex aperture excitation.

With reference to FIG. 4, a general relationship between mutual coupling parameters 305 of the steerable array 12 and a respective realized complex aperture excitation 310 is illustrated. An aperture excitation 310 of the steerable array 12 can be derived from measurements of the respective S-parameters 305. Also, the far field (or the near field) radiation pattern can be derived from the S-parameters given the relationship between the aperture excitation and the far field (or the near field) discussed with respect FIG. 3. The mutual coupling between the radiating elements or the steerable array 12 (such as an AESA) can be mathematically expressed as an S-parameter matrix, as is commonly known in the literature. The S-parameters 305 are essentially indirectly measured by the transceiver 14 as mutual coupling parameters between the NFPs 18 and the various configurations of radiating elements of the steerable array 12. Any impedance mismatches for the steerable array 12 radiating element affects both the amplitude and phase of the mutual coupling parameters. The S-parameters 305 vary with changes in the phase shifts (or time delays) and amplitudes associated with various antenna elements 20 of the steerable array 12, and, as such, the transceiver 14 may re-measure the mutual coupling parameters after adjustment of the phase shift (or time delay) parameters or the amplitude parameters associated with antenna elements 20. In some embodiments, calibration methods described in this disclosure do not require measuring the S-parameters 305 of the steerable array 12. In some impediments, with increased hardware complexity, the complete set of S-parameters 305 are measured by transceiver 14.

Figure 5:
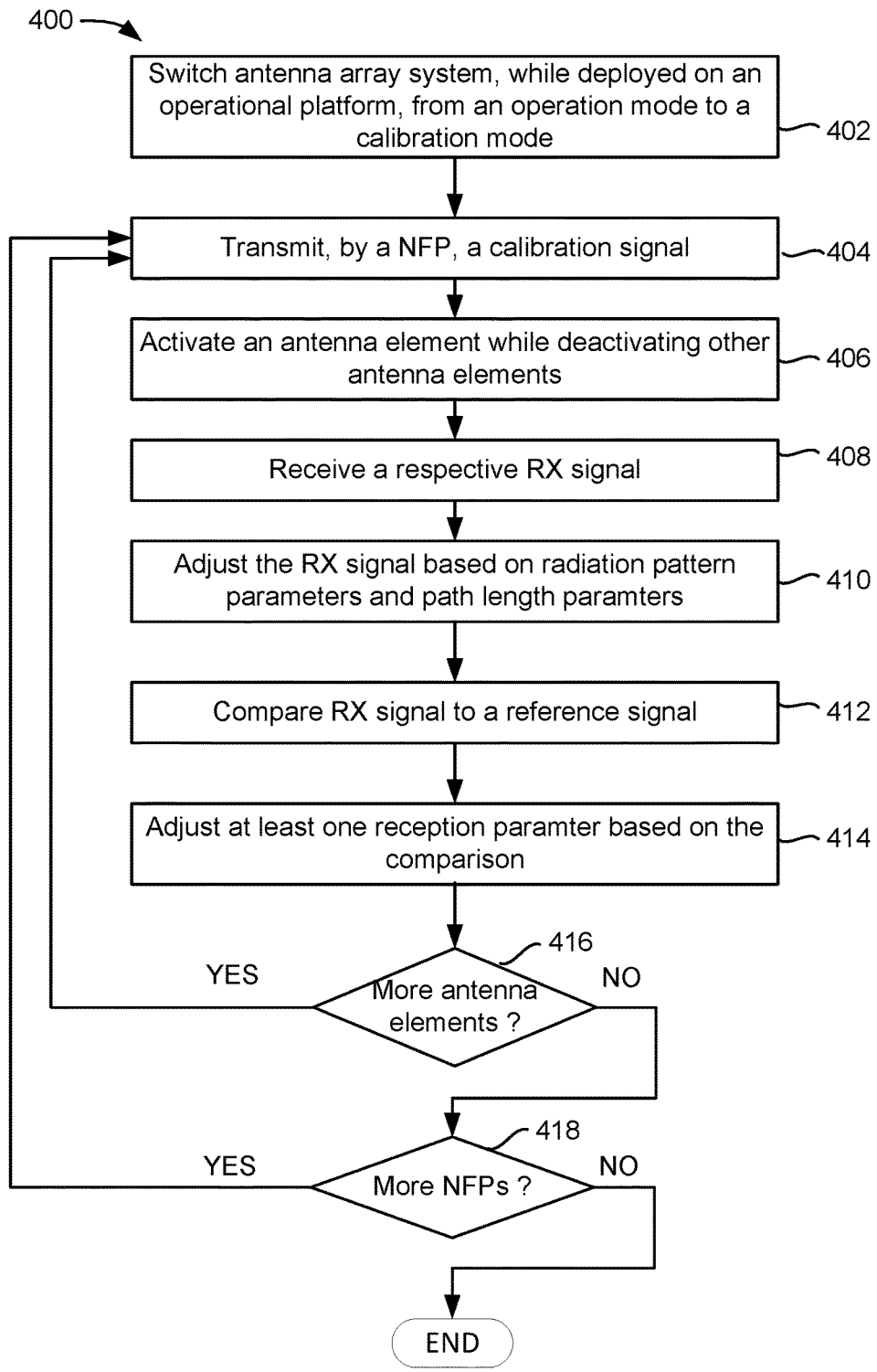
FIG. 5 is a flow diagram illustrating a method of calibrating a steerable array in reception mode, according to some embodiments of the inventive concepts disclosed herein.

With reference to FIG. 5, and in one embodiment, a method 400 of calibrating an antenna array system (such as antenna array system 10) in RX calibration sub-mode is depicted. In some embodiments, the antenna array system can support dual polarization and can include at least one choke ring and/or at least one artificial magnetic conductor as described above with regard to FIG. 2. The calibrating method 400 includes switching an antenna array system, while deployed on an operational platform, from an operation mode to a calibration mode (step 402), transmitting by a NFP a calibration signal (step 404), activating antenna element of the steerable array, (step 406), and receiving a respective RX signal (step 408). The method 400 also includes adjusting the RX signal based on one or more radiation pattern parameters of at least one antenna element, one or more radiation pattern parameters of the NFP, or at least one path length between the NFP and an antenna element (step 410). The method 400 includes comparing the RX signal to a reference signal (step 412), and adjusting at least one reception parameter based according to the comparison (step 414). The method 400 includes repeating steps 404-414 for various subsets of antenna elements (decision block 416) and repeating steps 404-416 for various NFPs (decision block 418). The method 400 represents a receive calibration method with the steering array acting as a receiver during the calibration procedure and the NFP(s) transmitting. The method 400 can be performed by the array control module 16. The array control module 16 can be implemented as hardware module(s), firmware module(s), software module(s), or a combination thereof. In some embodiments, the array control module 16 can be implemented as a distributed digital architecture with portions of the modules 30, 32 and 34 implemented within the digital circuitry/memory of the TRM RFIC. In such embodiments, one or more steps of the method 400 can be performed by the digital circuitry/memory of the TRM RFIC.

Referring to FIGS. 1 and 5, the method 400 can include the monitoring module 40 switching the antenna array system 10 (or the steerable array 12), while deployed on an operational platform, from an operation mode to a calibration mode. In some embodiments, the monitoring module 40 can be configured to periodically switch between the operation mode and the calibration mode. In some embodiments, the monitoring module 40 can be configured to monitor the health of the steering array 12 and switch to the calibration mode upon detecting a condition or event, such as a degradation of the health of the steering array 12 or a component thereof. In some embodiments, the monitoring module 40 can be configured to initiate the calibration mode upon detecting that the antenna array system 10 is in idle (e.g., neither receiving nor transmitting). Switching to (or initiating) the calibration mode can include the monitoring module 40 sending an indication or command (or handing over control) to the calibration control module 42. In some embodiments, the switching step 402 can be optional. For example, if the antenna array system 10 is already in the calibration mode, the calibration control module 42 can start the method 400 at step 404.

The method 400 includes the calibration control module 42 causing an NFP 18 to transmit a RF calibration signal (step 404). The calibration control module 42 can send the RF calibration signal to the NFP 18 via connection line(s) 17. In some embodiments, the connection line(s) 17 can be bidirectional. In the case where the antenna array system 10 includes multiple NFPs 18, the calibration control module 42 can select one of the NFPs 19 to transmit the calibration signal. The calibration control module 42 can select one NFP 18 at a time and cause the NFPs 18 to transmit the RF calibration signal sequentially. Responsive to receiving the RF calibration signal, a NFP 18 can generate and transmit a corresponding electromagnetic wave to be received by the steerable array 12. The electromagnetic wave can be linear polarized or dual polarized. In some embodiments, the calibration control module 42 can cause multiple NFPs 18 to transmit the RF calibration signal (or different RF calibration signals) simultaneously.

The method 400 can include the calibration control module 42 activating one of the plurality of antenna elements 20 while deactivation (or switching off) the other antenna elements 20 (step 406). In some embodiments, the calibration control module 42 can activate distinct antenna elements 20 sequentially, one at a time. In other words, the calibration control module 42 can iteratively cause the NFP 18 to transmit the RF calibration signal and activate a different antenna element 20 each time while deactivating the rest of antenna elements 20. In some embodiments, the calibration control module 42 can be configured to sequentially activate subsets of antenna elements 20, one at a time. In other words, considering N predefined subsets of antenna elements 20, the calibration control module can iteratively cause the NFP 18 to transmit the RF calibration signal and, at each iteration, activate a separate subset of antenna elements 20. For example, the calibration control module 42 can sequentially activate blocks (or clusters) of four, or any other number of, adjacent antenna elements 20, one block (or one cluster) at a time. The activated antenna element(s) 20 can receive the electromagnetic wave transmitted by the NFP 18. In some embodiments, the step of activating a subset of antenna elements 20 can be optional. For example, all the antenna elements 20 can be activated or in active mode by default.

The method 400 includes the steerable array 12 receiving a receive (RX) signal responsive to transmission of the RF calibration signal (step 408). In particular, the activated antenna element(s) 20 can receive RF signal(s), responsive to transmission of the RF calibration signal by the NFP(s) 18, which may undergo processing by the phase shifters (or time delay units) 22, RF amplifiers 24, and/or power combiners associated with the activated antenna elements 20 to form a single RX signal that is received by the transceiver 14. In some embodiments, the transceiver 14 can be connected to each antenna element 20 separately, for example, via couplers and, therefore, can receive a separate RX signal from each antenna element 20. In such embodiments, a plurality (or all) of the antenna elements 20 can be active to simultaneously receive the calibration signal.

The method 400 includes the calibration control module 42 adjusting the RX signal(s) using at least one radiation pattern parameter of the NFP, at least one radiation pattern parameter of a receiving antenna element, and/or a path length parameter associated with a propagation path between the NFP 18 and a receiving antenna element 20. The radiation pattern parameters of the NFP(s) and the antenna elements 20 and the distances separating the NFP(s) 18 and the various antenna element 20 can influence the amplitudes and phases of the RF signals received at various antenna elements 20 differently. Adjusting the RX signal(s) allows to account for the effect of such parameters on the RX signal(s). In particular, the calibration control module 42 can be configured to eliminate (or mitigate) the relative effects of the radiation patterns of the NFP(s) 18 and the antenna elements 20 and the relative effects of the propagation path lengths on RX signals received by various antenna elements 20. By eliminating such effects, the calibration control module 42 can calibrate the steerable array 12 to correct for any discrepancies between the performances or characteristics of various antenna elements and corresponding electric/electronic components (such as phase shifters, time delay units, RF amplifiers, power combiners, and/or power splitters) without inducing new discrepancies related to the calibration mode. In other words, any relative phase shifts and/or relative amplitude attenuations induced during calibration due to the relative locations of NFP(s) 18 and antenna elements 20 as well as the radiating characteristics of the NFP(s) 18 and antenna elements 20 can be accounted for.

Figure 6:
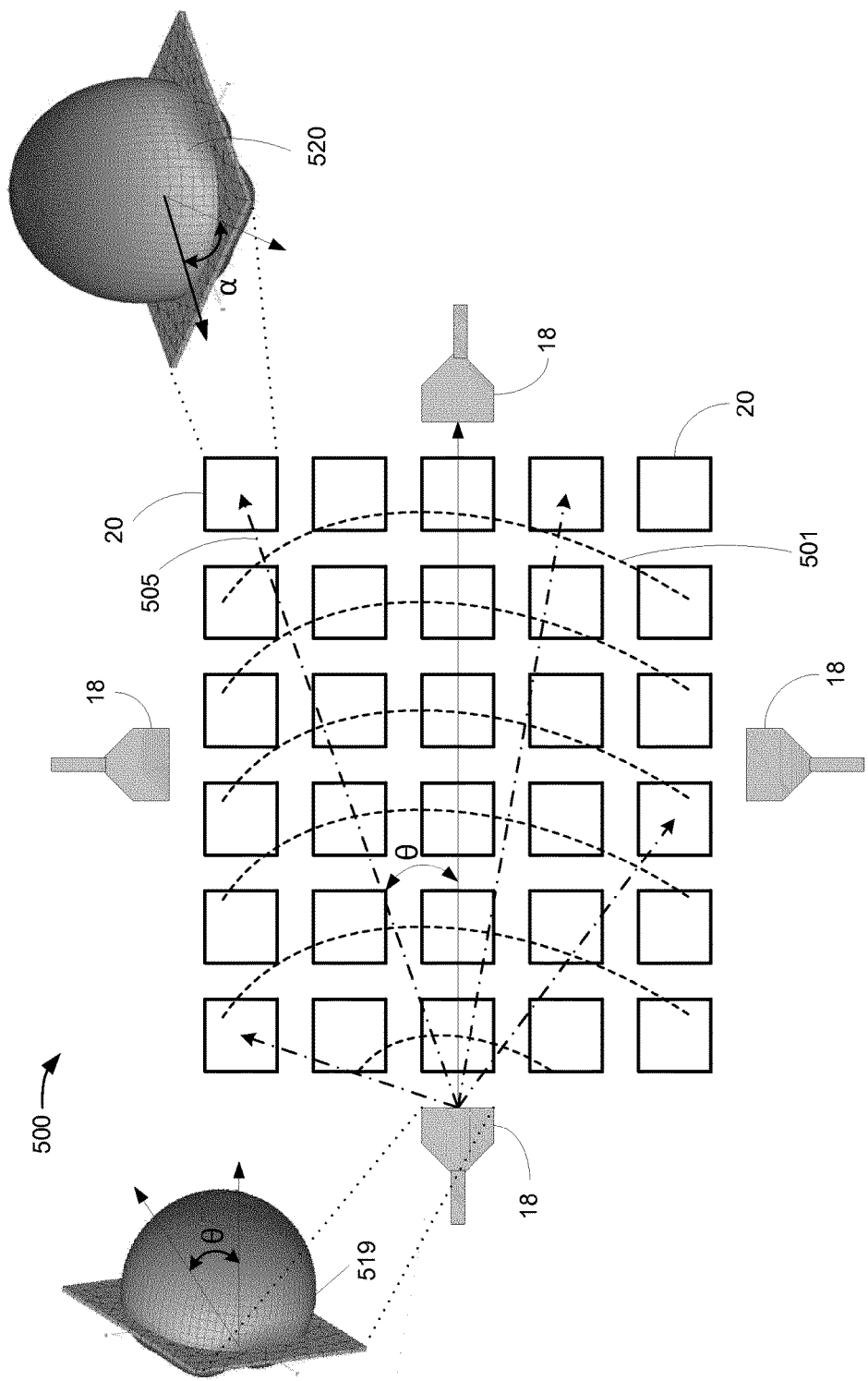
FIG. 6 is a diagram illustrating one embodiment of electromagnetic wave propagation between NFPs and antenna elements in an antenna array system.

With reference to FIG. 6 and in one embodiment, the effect of radiation patterns and path lengths associated with the NFP(s) 18 and the antenna elements 20 on RF signals received at various antenna elements 20 are illustrated via a graphical representation of electromagnetic wave propagation between the NFP(s) 18 and the antenna elements 20. Given a transmission radiation pattern 519 of a NFP 18, the amplitude and phase of an electromagnetic wave 501 generated by that NFP 18 vary according to a respective transmission lookup angle θ. Also, the reception radiation pattern 520 of an antenna element 20 controls the amplitude and phase of RF signals received by that antenna element 20 according to a reception lookup angle α. In addition, the amplitude and phase of the electromagnetic wave 501 generated by a NFP 18 depends on the distance traveled by the wave. In other words, the phase and/or amplitude of an RF signal received by an antenna element 20 depends on the distance 505 separating that antenna element and the transmitting NFP 18. Since the antenna elements 20 can be at different distances away from a transmitting NFP 18, the propagation path lengths can induce relative phase shifts and/or relative amplitude attenuations (e.g., with respect to one another) in RF signals received at various antenna elements 20.

The phase shifts (or time delays) and/or amplitude attenuations induced by radiation patterns of NFP(s) 18, radiation patterns of antenna elements 20, and/or path lengths can be precomputed (or pre-determined) based on the distances and lookup angles between various NFP-antenna element pairs and/or based on radiation patterns of separate NFPs 18 and separate antenna elements 20. Such phase shift (or time delay) values and amplitude attenuation values can be stored in a memory of the antenna array system 10. In some embodiments, the phase shifts (or time delays) and/or amplitude attenuations induced by radiation patterns of NFP(s), radiation patterns of antenna elements, or path lengths can be repeatedly computed dynamically and in real-time or "on the fly." While FIG. 6 shown specific examples of the radiation patterns 519 and 520, such radiation patterns can be of other shapes depending on the electromagnetic characteristics of the NFP(s) 18 and the antenna elements 20, respectively. Also, the radiation pattern 520 can change based on the location of the respective antenna element 20 within the array (e.g., at the center of the array, in the middle of an edge of the array, or at a corner of the array).

Referring back to FIGS. 1, 5 and 6, the calibration control module 42 can adjust the RX signal or a reference signal based on radiation pattern parameters associated with the transmitting NFP(s) 18 and the receiving antenna element(s) 20 or path lengths between such NFP(s) 18 and antenna elements 20. For example, for a RX signal associated with a transmitting NFP 18 and a receiving antenna element 20, the calibration control module 42 can subtract, from the RX signal, relative phase shifts, relative phase delays (or time delays), or relative amplitude attenuations due to the radiation pattern of that NFP, the radiation pattern of that antenna element, or the propagation path length between the NFP 18 and the antenna element 20. In some embodiments, the processor 34 can adjust the RX signal in the digital domain, after analog to digital conversion. In some embodiments, the calibration control module 42 can adjust the RX signal by applying phase shift (or time delay) value(s) to the phase shifter(s) (or time delay unit(s)) 22 associated with the receiving antenna element 20 and applying amplitude attenuation value(s) to the RF amplifier(s) 24 associated with the receiving antenna element 20. As such, the RX signal is already adjusted when received at the transceiver 14. In cases where the transceiver 14 is configured to receive multiple RX signals associated with multiple antenna elements receiving simultaneously, the calibration control module 42 can adjust each of the RX signals based on respective radiation pattern parameters and respective path length parameter(s).

In some embodiments the adjusting step 410 can be optional. For example, a plurality of NFPs 18 can be arranged at different locations in the vicinity of the array of antenna elements 20 and a separate NFP 18 can be used with each respective subset (or block) of antenna elements 20 such that the effect of the radiation patterns (of NFPs 18 and antenna elements 20) and the path lengths is substantially equal for different antenna elements 20.

The method 400 includes the calibration control module 42 comparing the RX signal to a respective reference signal (step 412). Comparing the RX signal to the respective reference signal can include comparing parameters (such as phase and amplitude) of the RX signal to corresponding parameters of the reference signal. In some embodiments, comparing the RX signal to the reference signal can include determining a phase shift and a relative amplitude weighting between the RX signal and the reference signal. In some embodiments, the reference signal can be a version of the RF calibration signal. In some embodiments, the reference signal can be another RX signal received by another antenna element 20 (or another block of antenna elements).

In some embodiments, the calibration control module 42 can apply the adjustment in step 410 to the reference signal (or parameters thereof) instead of applying it to the RX signal(s). In other words, similar phase shifts (or time delays) and/or amplitude attenuations as those induced in the RX signal, due to the radiation patterns and the propagation path length, can be induced or introduced into the respective reference signal before the comparison process at step 412.

The method 400 can include the calibration control module 42 adjusting at least one reception parameter based on the comparison between the RX signal and the reference signal (step 414). For example, the calibration control module 42 can adjust at least one phase shift (or time delay) value of at least one phase shifter (or time delay unit) 20 associated with the receiving antenna element(s) 20, or can adjust at least one amplitude (or power) attenuation/amplification value of at least one RF amplifier 24 associated with the receiving antenna element 20. Given a determined phase (or time delay) difference between the RX signal and the respective reference signal, the calibration control module 42 can adjust a phase shifter 22 (or time delay unit) associated with the receiving antenna element 20 to correct for such phase difference. Also, given a determined amplitude (or power) difference between the RX signal and the respective reference signal, the calibration control module 42 can adjust an RF amplifier 24 associated with the receiving antenna element 20 to correct for such amplitude/power difference.

In some embodiments where the calibration control module 42 is configured to activate one antenna element 20 (or one subset/block of antenna elements) at a time, the calibration control module 42 can repeat steps 404-414 (decision block 416) by activating a new antenna element 20 (or new subset/block of antenna elements). Such repetition can be optional. For example, if all antenna elements 20 are activated simultaneously, the respective reception parameters can be adjusted all at once. In some embodiments, the calibration control module 42 can repeat steps 404 through 414 with a different transmitting NFP 18 at each iteration (decision block 418). Such repetitions or certain steps can be optional, e.g., depending on the calibration process. For example, a single transmitting NFP 18 can be used for calibrating the steering array 12.

The flow chart in FIG. 5 illustrates some embodiments of the reception calibration method. For example, as discussed above, the step 402, 406, and 410 and the decision blocks 416 and 418 can be optional. For example and in certain embodiments, all the antenna elements 20 can be activated simultaneously, corresponding RX signals (each associated with a respective antenna element) can be compared to a reference signal, and reception parameters associated with various antenna elements 20 can be adjusted all at once.

Figure 7:
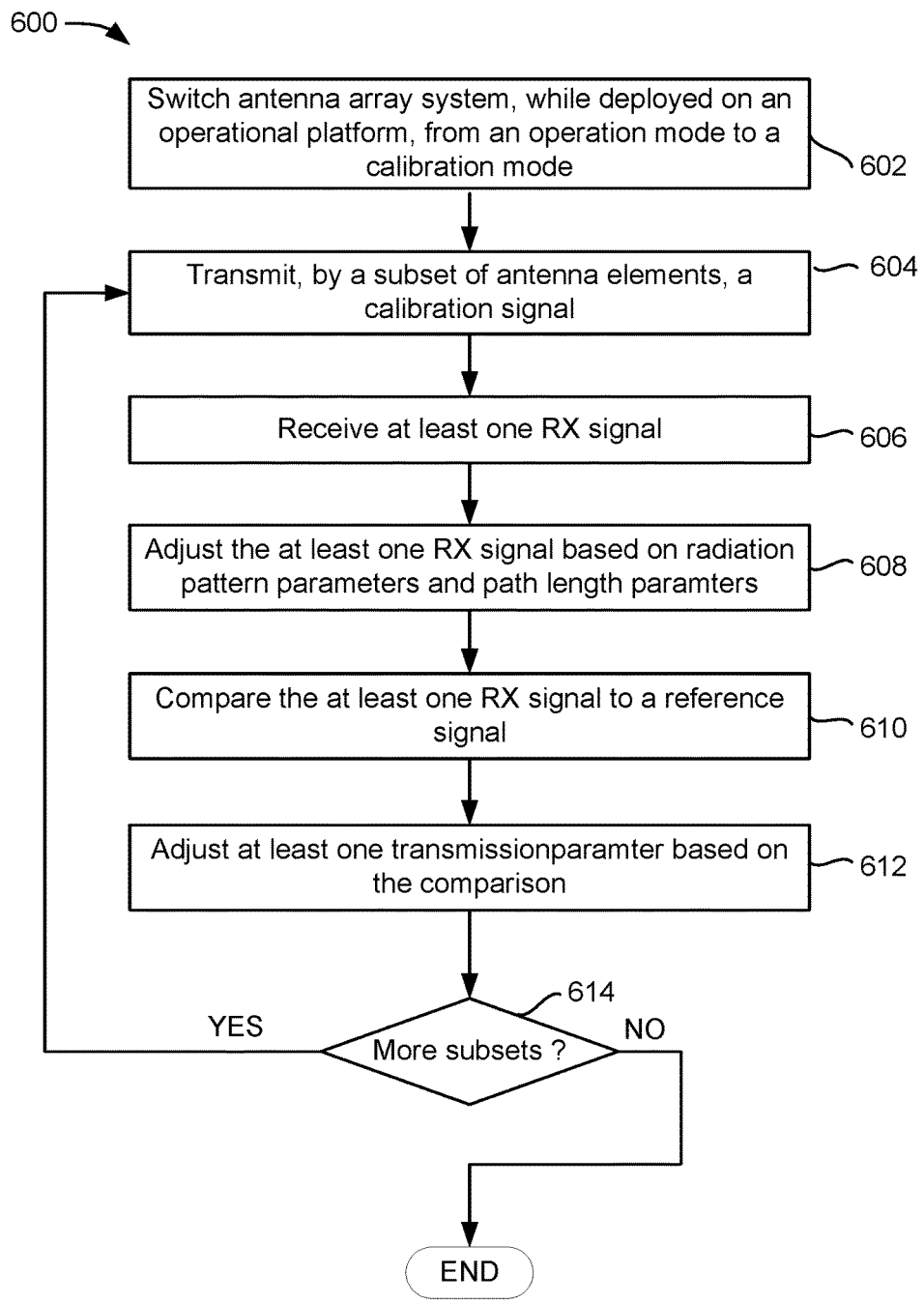
FIG. 7 is a flow diagram illustrating a method of calibrating a steerable array in a transmit mode, according to certain embodiments of the inventive concepts disclosed herein.

With reference to FIG. 7, a method 600 of calibrating an antenna array system (such as antenna array system 10) in a TX calibration sub-mode includes switching an antenna array system, while deployed on an operational platform, from an operation mode to a calibration mode (step 602), transmitting by subset of antenna element a calibration signal (step 604), and receiving one or more RX signals b one or more NFPs (step 606). The method 600 also includes adjusting the at least one RX signal based on one or more radiation pattern parameters of the subset of antenna elements, one or more radiation pattern parameters of the one or more NFPs 18, or one or more path lengths between the one or more NFPs 18 and the subset of antenna elements (step 608). The method 600 also includes comparing the one or more RX signals to a reference signal (step 610), and adjusting at least one transmission parameter according to the comparison (step 612). The method 600 also includes repeating steps 604-612 for various subsets of antenna elements (decision block 614). The method 600 represents a transmission calibration method with the steering array acting as a transmitter during the calibration procedure and the NFP(s) acting as receiver(s). In some embodiments, the antenna array system can support dual polarization and can include at least one choke ring and/or at least one artificial magnetic conductor as described above with regard to FIG. 2.

Referring to FIGS. 1 and 7, the method 600 can include the monitoring module 40 switching the antenna array system 10 (or the steerable array 12), while deployed on an operational platform, from an operation mode to a calibration mode. In some embodiments, the monitoring module 40 can be configured to periodically switch between the operation mode and the calibration mode. In some embodiments, the monitoring module 40 can be configured to monitor the health of the steering array 12 and switch to the calibration mode upon detecting a degradation of the health of the steering array 12 or a component thereof. In some embodiments, the monitoring module 40 can be configured to initiate the calibration mode upon detecting that the antenna array system 10 is in an idle mode (e.g., neither receiving nor transmitting). In some embodiments, the switching step 602 can be optional. For example, if the antenna array system 10 is already in the calibration mode (for example after performing method 400), the calibration control module 42 can start the method 600 at step 604. The method 600 can be performed by the array control module 16. The array control module 16 can be implemented as hardware module(s), firmware module(s), software module(s), or a combination thereof. In some embodiments, the array control module 16 can be implemented as a distributed digital architecture with portions of the modules 30, 32 and 34 implemented within the digital circuitry/memory of the TRM RFIC. In such embodiments, one or more steps of the method 600 can be performed by the digital circuitry/memory of the TRM RFIC.

The method 600 includes the calibration control module 42 causing a subset (or a block) of antenna elements to transmit a RF calibration signal (step 604). The calibration control module 42 can send the RF calibration signal to the NFP 18 via connection line(s) 17. The calibration control module 42 can select a subset among a plurality of subsets of antenna elements to transmit the calibration signal. The subset of antenna elements can include a single antenna element 20, a block of adjacent antenna elements, or any number of antenna elements 20. Responsive to receiving the RF calibration signal, the selected subset of antenna elements 20 can generate and transmit a corresponding electromagnetic wave to be received by the one or more NFPs 18. The electromagnetic wave can be linear polarized or dual polarized.

The method 600 includes the one or more NFPs 18 receiving one or more respective RX signals responsive to the transmission of the RF calibration signal by the subset of antenna elements 20 (step 606). Each NFP 18 can send the respective RX signal to the calibration control module 42, for example, via the connections 17.

The method 600 includes the calibration control module 42 adjusting each RX signal using the radiation pattern parameter(s) of the respective NFP, the radiation pattern parameter(s) of subset of antenna elements, and/or the path length parameter(s) associated with the propagation path between the subset of antenna elements 20 and the NFP 19 (step 608). Here, the reception radiation pattern of the NFP (representing the radiation pattern of the NFP in reception mode) can be used. For the subset of antenna elements 20, respective transmission radiation pattern(s) (representing one or more radiation patterns of the subset of antenna elements while in transmission mode) can be employed. For the subset of antenna elements 20, a single transmission radiation pattern for the whole subset can be computed or a transmission radiation pattern of an antenna element 20 in the subset can be used. The adjustment of each RX signal in step 608 can be performed similar to or as described above with respect to step 410 of FIG. 5, e.g., with the exception that parameters of the reception radiation pattern of the NFP and parameters of the transmission radiation pattern(s) of the subset of antenna elements are used. In some embodiments, a single radiation for each antenna element 20 (or a cluster of antenna elements 20) can be used both in RX and TX calibration. Also, for each NFP 18, as ingle radiation pattern can be used in both RX and TX calibration. Radiation patterns of the NFP(s) 18 and the antenna elements 20 (or clusters of antenna elements) can be precomputed and stored in a memory of the antenna array system 10.

In some embodiments the adjusting step 608 can be optional or omitted. For example, a plurality of NFPs 18 can be arranged at different locations in the vicinity of the array of antenna elements 20 and a separate NFP 18 can be assigned (the receiver role) for respective subset (or block) of transmitting antenna elements 20, such that the effect of the radiation patterns (of NFPs 18 and the subsets of antenna elements 20) and the respective path lengths are substantially equal (e.g., equal within 1% or 2% margin error) for distinct pairs of NFP-subset of antenna elements.

The method 600 includes the calibration control module 42 comparing each RX signal to a reference signal (step 610). The comparison of each RX signal to the reference signal can be performed similar to or as discussed above with respect to step 412 of FIG. 4. In some embodiments, the reference signal can be a version of the RF calibration signal. In some embodiments, the reference signal can be another RX signal received by the same NFP 18 responsive to transmission by another subset of antenna elements 20. In some embodiments, the calibration control module 42 can apply the adjustment(s) in step 608 to the reference signal (or parameters thereof) instead of applying such adjustment(s) to the RX signal(s). In other words, prior to comparing a given RX signal to the reference signal, the reference signal can be adjusted based on parameters of the radiation pattern of the respective receiving NFP 18, parameters of the radiation pattern(s) of the subset of transmitting antenna elements, and the propagation path length between the transmitting subset of antenna elements and the receiving NFP 18.

The method 600 includes the calibration control module 42 adjusting at least one transmission parameter of the steerable array 12 based on the comparison of the RX signal to the reference signal (step 612). For example, the calibration control module 42 can adjust at least one phase shift (or time delay) value of at least one phase shifter 22 (or time delay unit) associated with the transmitting subset of antenna elements 20, or can adjust at least one amplitude (or power) attenuation/amplification value of at least one RF amplifier 24 associated with the transmitting subset of antenna elements 20. Given a determined phase (or time delay) difference between a given RX signal and the reference signal, the calibration control module 42 can adjust a phase shifter 22 (or time delay unit) associated with the transmitting subset of antenna elements 20 to correct for such phase difference. Also, given a determined amplitude (or power) difference between the RX signal and the reference signal, the calibration control module 42 can adjust an RF amplifier 24 associated with the transmitting subset of antenna elements 20 to correct for such amplitude/power difference. The method 600 can also include the calibration control module 42 repeating steps 604-612 for various subsets of antenna elements 20 (decision block 614). Such repetitions can be optional or not present in some embodiments.

The flow chart in FIG. 7 illustrates certain implementations of the transmission calibration method. For example, the order of some of the steps in FIG. 7 can be implemented in various different ways. Also, as discussed above, the steps 602 and 608 and the decision block 614 can be optional. In some embodiments, the methods described in relation with FIGS. 5 and 7 can be performed sequentially in any order. Also, each of the methods described in relation with FIGS. 5 and 7 can be implemented using computer code instructions stored on a non-transitory computer-readable medium.

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements may be reversed or otherwise varied and the nature or number of discrete elements or positions may be altered or varied. Accordingly, all such modifications are intended to be included within the scope of the inventive concepts disclosed herein. The order or sequence of any operational flow or method operations may be varied or re-sequenced according to alternative embodiments. Other substitutions, modifications, changes, and omissions may be made in the design, operating conditions and arrangement of the exemplary embodiments without departing from the broad scope of the inventive concepts disclosed herein.

The present disclosure contemplates methods, systems and program products on any machine-readable media for accomplishing various operations. Embodiments of the inventive concepts disclosed herein may be implemented using existing computer operational flows, or by a special purpose computer operational flows for an appropriate system, incorporated for this or another purpose, or by a hardwired system. Embodiments within the scope of the inventive concepts disclosed herein include program products comprising machine-readable media for carrying or having machine-executable instructions or data structures stored thereon. Such machine-readable media can be any available media that can be accessed by a special purpose computer or other machine with an operational flow. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with an operational flow. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a special purpose computer, or special purpose operational flowing machines to perform a certain function or group of functions.

What is claimed is:

1. An antenna array system comprising:
an array of antenna elements;
at least one near-field probe (NFP) arranged in a vicinity of the antenna elements, the at least one NFP configured to support dual polarization; and
a processor coupled to the array of antenna elements and to the at least one NFP, the processor configured to:
dynamically switch the antenna array system, while deployed on an operational platform, from an operation mode to a calibration mode; and
calibrate the array of antenna elements according to at least one of a receive (RX) calibration sub-mode and a transmit (TX) calibration sub-mode, wherein in a RX calibration sub-mode, processor is configured to:
cause the at least one NFP to transmit a first calibration signal;
receive, from the array of antenna elements, a first receive (RX) signal responsive to the calibration signal;
compare the first RX signal to a first reference signal; and
adjust at least one signal reception parameter associated with at least one antenna element of the array of antenna elements based on the comparison of the first RX signal to the first reference signal, and
wherein in the TX calibration sub-mode, the processor is configured to:
cause one or more antenna elements of the array of antenna elements to transmit a second calibration signal;
receive, from the at least one NFP, at least one other RX signal responsive to the second calibration signal, each of the at least one other RX signal associated with a respective NFP;
compare each of the at least one other RX signal to a second reference signal; and
adjust at least one signal transmission parameter associated with at least one antenna element of the one or more antenna elements according to the comparison of each of the at least one other RX signal to the second reference signal.

2. The antenna array system of claim 1 further comprising a ground plane and at least one of:
an artificial magnetic conductor arranged between the ground plane and one of the at least one NFP;
an artificial magnetic conductor arranged between the ground plane and the array of antenna elements;
a choke ring arranged between the ground plane and one of the at least one NFP; and
a choke ring arranged between the ground plane and the array of antenna elements.

3. The antenna array system of claim 1 further comprising a network of one or more radio frequency (RF) amplifiers and phase shifters coupled to the array of antenna elements.

4. The antenna array system of claim 1, further comprising a network of one or more radio frequency (RF) amplifiers and time delay units coupled to the array of antenna elements.

5. The antenna array system of claim 1, wherein adjusting the at least one signal reception parameter includes at least one of:
adjusting at least one signal amplitude parameter of at least one radio frequency (RF) amplifier coupled to the at least one antenna element;
adjusting at least one signal phase parameter of at least one phase shifter coupled to the at least one antenna element; or
adjusting at least one signal time delay parameter of at least one time delay unit coupled to the at least one antenna element.

6. The antenna array system of claim 1, wherein the processor is configured in the RX calibration sub-mode to, for each subset of a plurality of subsets of antenna elements in the array of antenna elements:
activate the subset of antenna elements while deactivating antenna elements in other subsets of antenna elements,
cause the at least one NFP to transmit the first calibration signal;
receive a RX signal associated with the activated subset of antenna elements responsive to the first calibration signal;
compare the first RX signal associated with the activated subset of antenna elements to a first reference signal; and
adjust one or more signal reception parameters associated with the activated subset of antenna elements, according to the comparison of the RX signal associated with the activated subset of antenna elements to the first reference signal.

7. The antenna array system of claim 1, wherein the processor is further configured to calibrate the array of antenna elements according to the RX calibration sub-mode and the TX calibration sub-mode sequentially.

8. The antenna array system of claim 1, wherein the processor is configured in the TX calibration sub-mode to, for each subset of a plurality of subsets of antenna elements in the array of antenna elements:
cause the subset of antenna elements to transmit the second calibration signal;
receive, from the at least one NFP, at least one other RX signal responsive to the second calibration signal, each of the at least one other RX signal associated with a respective NFP;
compare each of the at least one other RX signal to the second reference signal; and
adjust at least one signal transmission parameter associated with the subset of antenna elements, according to the comparison of each of the at least one other RX signal to the second reference signal.

9. An antenna array system comprising:
an array of antenna elements;
a near-field probe (NFP) arranged in a vicinity of the antenna elements;
a processor coupled to the array of antenna elements and to the NFP the processor configured to:
dynamically switch the antenna array system, while deployed on an operational platform, from an operation mode to a calibration mode; and calibrate the array of antenna elements according to at least one of a receive (RX) calibration sub-mode and a transmit (TX) calibration sub-mode, wherein in the RX calibration sub-mode, the processor is configured to, for each subset of a plurality of subsets of antenna elements in the array of antenna elements:

activate the subset of antenna elements while deactivating other subsets of antenna elements in the array of antenna elements;

cause the NFP to transmit a first calibration signal;

receive, from the array of antenna elements, a receive (RX) signal responsive to the calibration signal, the RX signal associated with the activated subset of antenna elements;

adjust the RX signal associated with the activated subset of antenna elements according to at least one radiation pattern parameter of the activated subset of antenna elements, at least one radiation pattern parameter of the NFP, and at least one propagation path length between the activated subset of antenna elements and the NFP;

compare the adjusted RX signal associated with the activated subset of antenna elements to a first reference signal; and adjust at least one signal reception parameter associated with the activated subset of antenna elements according to the comparison of the adjusted RX signal associated with the activated subset of antenna elements to the first reference signal wherein in the TX calibration sub-mode, the processor is configured to, for each subset of a plurality of subsets of antenna elements in the array of antenna elements:

cause the subset of antenna elements to transmit a second calibration signal;

receive, from the NFP, a second RX signal responsive to the second calibration signal;

adjust the second RX signal according to at least one radiation pattern parameter of the subset of antenna elements, at least one radiation pattern parameter of the NFP, and at least one propagation path length between the subset of antenna elements and the NFP;

compare the adjusted second RX signal to a second reference signal; and adjust at least one signal transmission parameter associated with the subset of antenna elements according to the comparison of the adjusted second RX signal to the second reference signal.

10. The antenna array system of claim 9, wherein the NFP includes a dual polarized NFP.

11. The antenna array system of claim 9 further comprising at least one choke ring or at least one artificial magnetic conductor.

12. The antenna array system of claim 9 further comprising a network of one or more radio frequency (RF) amplifiers and phase shifters coupled to the array of antenna elements.

13. The antenna array system of claim 9 further comprising a network of one or more radio frequency (RF) amplifiers and time delay units coupled to the array of antenna elements.

14. The antenna array system of claim 9, wherein the at least one radiation pattern parameter of the activated subset of antenna elements includes at least one of a radiation amplitude associated with a lookup angle, a radiation phase associated with the lookup angle, and a radiation time delay associated with the lookup angle.

15. The antenna array system of claim 9, wherein the at least one radiation pattern parameter of the NFP includes at least one of a radiation amplitude associated with a lookup angle, a radiation phase associated with the lookup angle, and a radiation time delay associated with the lookup angle.

16. The antenna array system of claim 9, wherein adjusting the at least one signal reception parameter includes at least one of:

adjusting at least one signal amplitude parameter of at least one radio frequency (RF) amplifier coupled to the activated subsets of antenna elements;

adjusting at least one signal phase parameter of at least one phase shifter coupled to the activated subset of antenna elements; and adjusting at least one signal time delay parameter of at least one time delay unit coupled to the activated subset of antenna elements.

17. The antenna array system of claim 9, wherein adjusting the at least one signal transmission parameter includes at least one of:

adjusting at least one signal amplitude parameter of at least one radio frequency (RF) amplifier coupled to the subset of antenna elements transmitting the second calibration signal;

adjusting at least one signal phase parameter of at least one phase shifter coupled to the subset of antenna elements transmitting the second calibration signal; and adjusting at least one signal time delay parameter of at least one time delay unit coupled to the subset of antenna elements transmitting the second calibration signal.

18. A method for calibrating an antenna array system, the method comprising:

dynamically switching, by a processor, an antenna array system, while deployed on an operational platform, from an operational mode to a calibration mode; and calibrate, by the processor, an array of antenna elements of the antenna array system according to at least one of a receive (RX) calibration sub-mode and a transmit (TX) calibration sub-mode, wherein in a RX calibration sub-mode, processor is configured to, for each subset of a plurality of subsets of antenna elements in an array of antenna elements of the antenna array system, activating, by a processor, the subset of antenna elements while deactivating other subsets of antenna elements in the array of antenna elements;

transmitting, by a near field probe (NFP) of the antenna array system, a first calibration signal;

receiving, by the processor from the array of antenna elements, a first receive (RX) signal responsive to the calibration signal, the RX signal associated with the activated subset of antenna elements;

adjusting, by the processor, the RX signal associated with the activated subset of antenna elements based on at least one radiation pattern parameter of the activated subset of antenna elements, at least one radiation pattern parameter of the NFP, and at least one propagation path length between the activated subset of antenna elements and the NFP;

comparing, by the processor, the adjusted RX signal associated with the activated subset of antenna elements to a first reference signal; and adjusting, by the processor, at least one signal reception parameter associated with the activated subset of antenna elements according to the comparison of the adjusted RX signal associated with the activated subset of antenna elements to the first reference signal wherein in the TX calibration sub-mode, the processor is configured to, for each subset of a plurality of subsets of antenna elements in the array of antenna elements:

causing, by the processor, the subset of antenna elements to transmit a second calibration signal;

receive, by the processor, from the NFP, a second RX signal responsive to the second calibration signal;

adjust the second RX signal according to at least one radiation pattern parameter of the subset of antenna elements, at least one radiation pattern parameter of the NFP, and at least one propagation path length between the subset of antenna elements and the NFP;

compare the adjusted second RX signal to a second reference signal; and adjust at least one signal transmission parameter associated with the subset of antenna elements according to the comparison of the adjusted second RX signal to the second reference signal.

19. The method of claim 18, wherein adjusting the at least one signal reception parameter includes at least one of:

adjusting at least one signal amplitude parameter of at least one radio frequency (RF) amplifier coupled to the activated subset of antenna elements;

adjusting at least one signal phase parameter of at least one phase shifter coupled to the activated subset of antenna elements; or adjusting at least one signal time delay parameter of at least one time delay unit coupled to the activated subset of antenna elements.

20. The method of claim 18, wherein adjusting the at least one signal transmission parameter includes at least one of:

adjusting at least one signal amplitude parameter of at least one radio frequency (RF) amplifier coupled to the subset of antenna elements transmitting the second calibration signal;

adjusting at least one signal phase parameter of at least one phase shifter coupled to the subset of antenna elements transmitting the second calibration signal; and adjusting at least one signal time delay parameter of at least one time delay unit coupled to the subset of antenna elements transmitting the second calibration signal.

* * * * *